(12) United States Patent
Watanabe et al.

(10) Patent No.: US 7,570,103 B2
(45) Date of Patent: Aug. 4, 2009

(54) SEMICONDUCTOR DEVICE INCLUDING CAPACITIVE CIRCUIT AND SHORT-CIRCUIT PREVENTING CIRCUIT CONNECTED IN SERIES

(75) Inventors: Eiichirou Watanabe, Kanagawa (JP); Yasushi Nakahara, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 280 days.

(21) Appl. No.: 11/641,017

(22) Filed: Dec. 19, 2006

(65) Prior Publication Data

US 2007/0164363 A1 Jul. 19, 2007

(30) Foreign Application Priority Data

Dec. 20, 2005 (JP) .............................. 2005-365756

(51) Int. Cl.
*H01H 85/00* (2006.01)
(52) U.S. Cl. ....................................... 327/525
(58) Field of Classification Search ................. 327/524, 327/525; 361/42, 56
See application file for complete search history.

(56) References Cited

U.S. PATENT DOCUMENTS

| 5,087,999 | A | * | 2/1992 | Sato et al. ...................... 361/17 |
| 5,825,601 | A | * | 10/1998 | Statz et al. ..................... 361/56 |
| 5,838,146 | A | * | 11/1998 | Singer ......................... 323/270 |
| 5,905,398 | A | * | 5/1999 | Todsen et al. ................ 327/337 |
| 6,888,398 | B2 | * | 5/2005 | Koehl et al. .................. 327/525 |

FOREIGN PATENT DOCUMENTS

JP 5-47808 2/1993

* cited by examiner

*Primary Examiner*—Lincoln Donovan
*Assistant Examiner*—Hai L Nguyen
(74) *Attorney, Agent, or Firm*—Young & Thompson

(57) ABSTRACT

In a semiconductor circuit device including a first terminal adapted to receive a first voltage and a second terminal adapted to receive a second voltage lower than the first voltage, a capacitive circuit and a short-circuit preventing circuit are provided in series between the first and second terminals. In this case, when the capacitive element is in an insulating (non-conductive) state, the short-circuit preventing circuit is in a conductive state, while, when the capacitive circuit is in a conductive state, the short-circuit preventing circuit is in an insulating state.

12 Claims, 13 Drawing Sheets

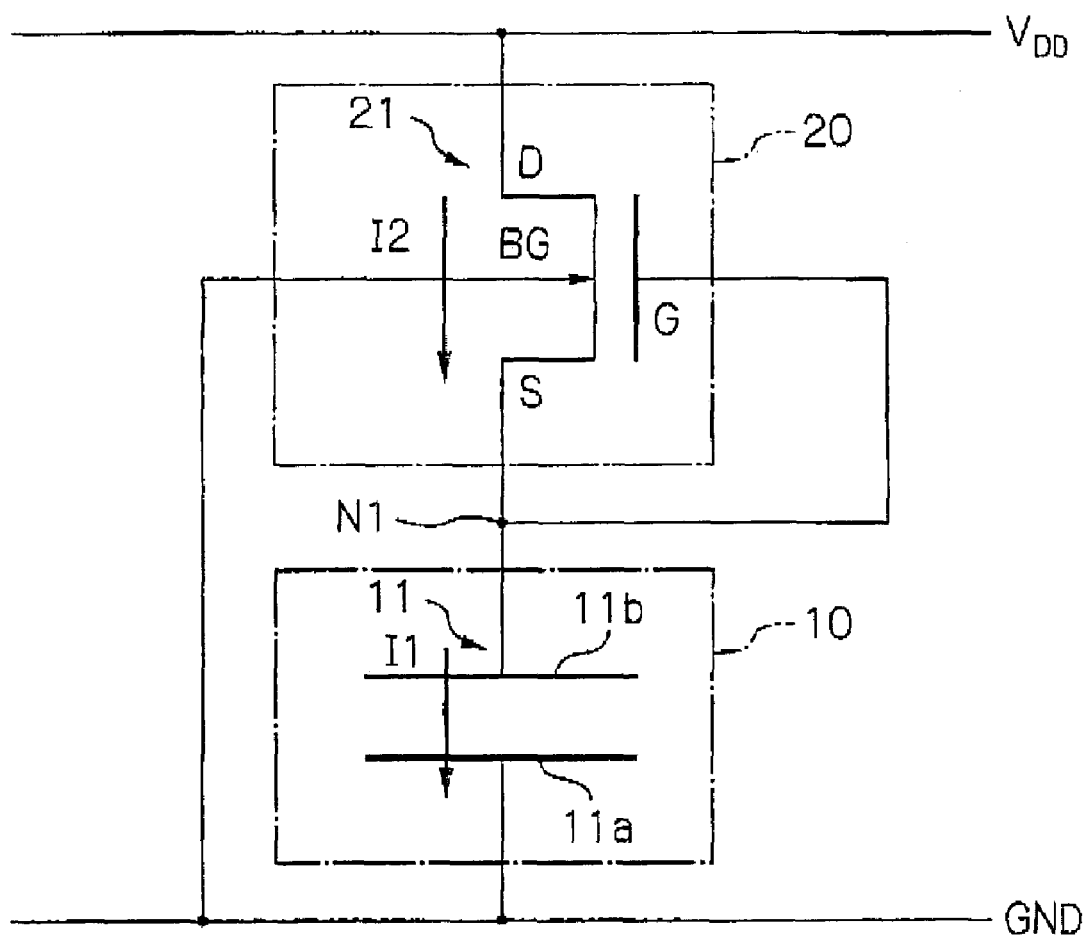

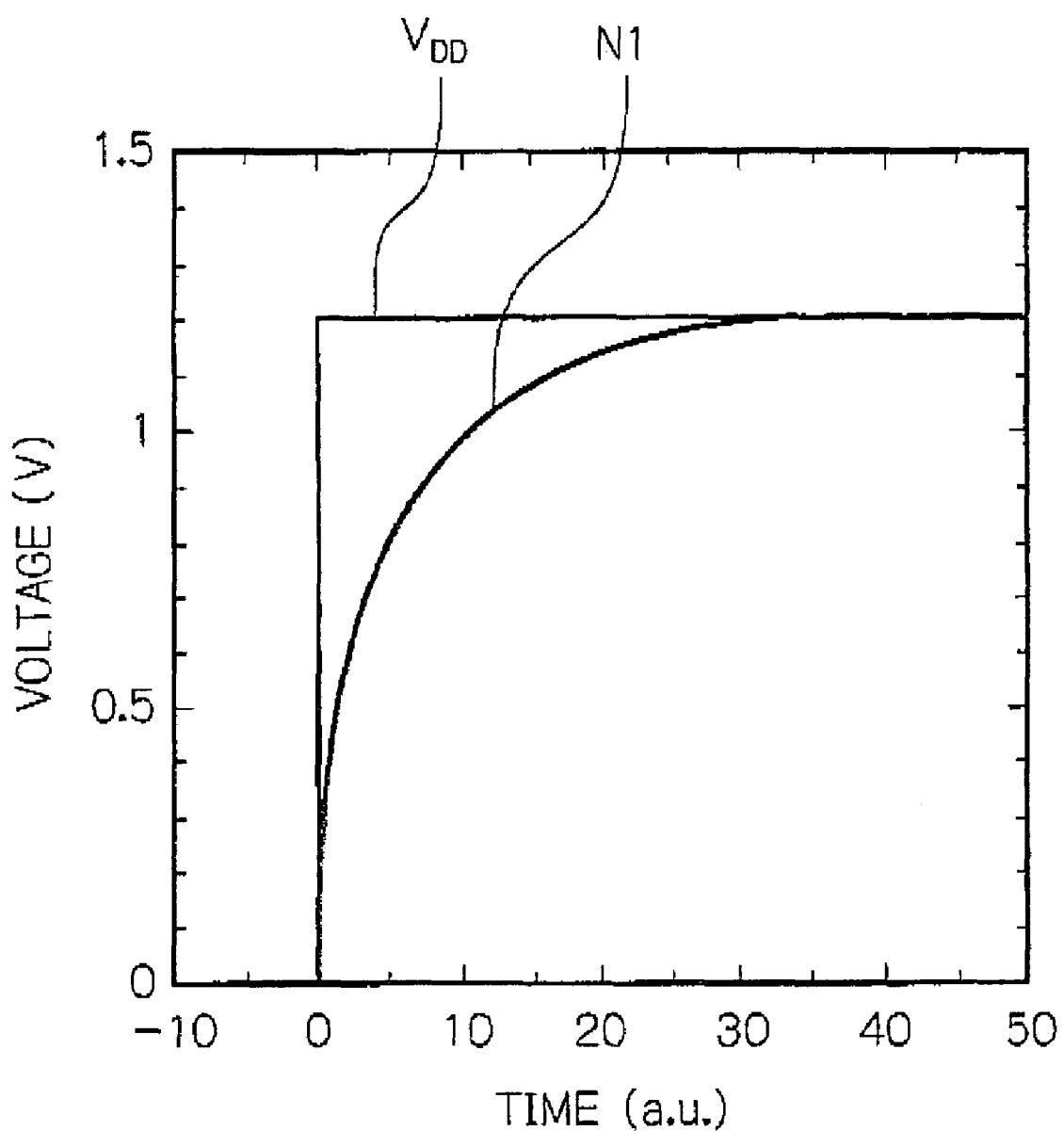

SEMICONDUCTOR DEVICE INCLUDING CAPACITIVE CIRCUIT AND SHORT-CIRCUIT PREVENTING CIRCUIT CONNECTED IN SERIES

BACKGROUND OF THE INVENTION

1. Field of the Invention

The present invention relates to a semiconductor circuit device including a capacitive circuit such as a decoupling capacitor provided between two power supply terminals.

2. Description of the Related Art

As the Internet has been rapidly developed, a higher integration, a higher frequency and a lower power supply voltage have been required in a semiconductor circuit device, i.e., a so called semiconductor large integrated circuit (LSI) device used in an Internet-related digital apparatus of a network server or the like.

A prior art semiconductor circuit device is constructed by two terminals such as a power supply terminal and a ground terminal adapted to receive different voltages from each other and a capacitive element serving as a decoupling capacitor connected between the two terminals adapted to absorb power supply voltage noise generated in the two terminals (see: JP-5-47808-A).

SUMMARY OF THE INVENTION

In the above-described prior art semiconductor circuit device, however, when the capacitive element is electrostatically broken, i.e., when the two electrodes of the capacitive element are short-circuited, the two terminals are short-circuited.

According to the present invention, in a semiconductor circuit device including a first terminal adapted to receive a first voltage and a second terminal adapted to receive a second voltage lower than the first voltage, a capacitive circuit and a short-circuit preventing circuit are provided in series between the first and second terminals. In this case, when the capacitive element is in an insulating (non-conductive) state, the short-circuit preventing circuit is in a conductive state, while, when the capacitive circuit is in a conductive state, the short-circuit preventing circuit is in an insulating state.

Thus, even when the capacitive circuit is electrostatically broken, the generation of a short-circuited state between the two terminals can be prevented by the short-circuit preventing circuit.

BRIEF DESCRIPTION OF THE DRAWINGS

The present invention will be more clearly understood from the description set forth below, with reference to the accompanying drawings, wherein:

FIG. 2 is a circuit diagram for explaining a normal operation of the semiconductor circuit device of FIG. 1;

FIG. 3 is a timing diagram for explaining the normal operation of the semiconductor circuit device of FIG. 2;

DESCRIPTION OF THE PREFERRED EMBODIMENTS

Figure 1:
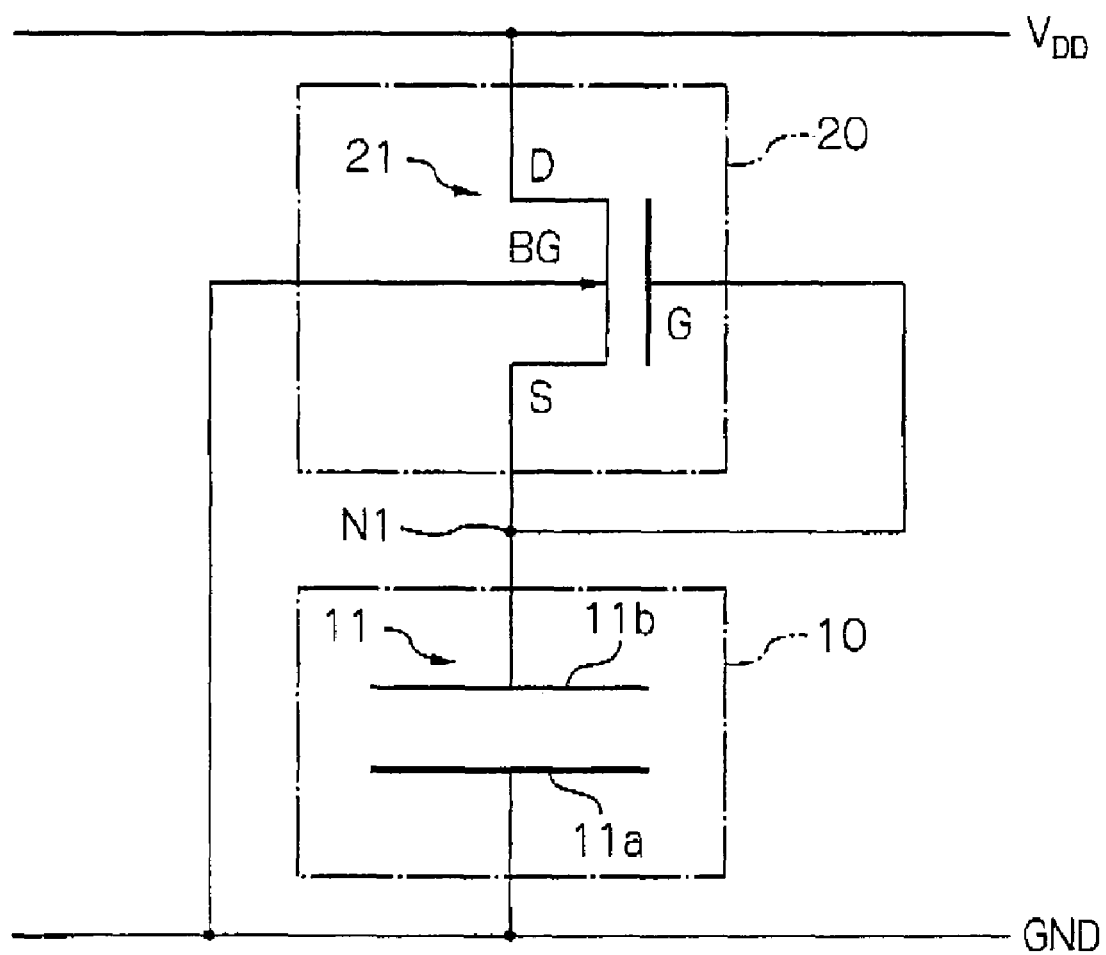
FIG. 1 is a circuit diagram illustrating a first embodiment of the semiconductor circuit device according to the present invention.

In FIG. 1, which illustrates a first embodiment of the semiconductor circuit device according to the present invention, a capacitive circuit 10 including a single capacitive element 11 and a short-circuit preventing circuit 20 including a single n-channel enhancement-type MOS transistor 21 are connected in series between two power supply terminals, i.e., a power supply terminal $V_{DD}$ and a ground terminal GND. In this case, the power supply terminal $V_{DD}$ is adapted to receive a positive power supply voltage such as 1.2V and the ground terminal GND is adapted to receive a ground voltage lower than the positive power supply voltage.

In more detail, the capacitive element 11 has an electrode 11a connected to the ground terminal GND and an electrode 11b connected to a node N1. For example, the area of each of the electrodes 11a and 11b is 10 μm², so that the capacitance of the capacitive element 11 is 1.23 pF. Note that an the capacitive element 11 can be of a MOS type. Also, the n-channel enhancement-type MOS transistor 21 has a source S connected to the node N1, i.e., the electrode 11b of the capacitive element 11, a drain D connected to the power supply terminal $V_{DD}$, a gate G connected to the node N1, i.e., the electrode 11b of the capacitive element 11, and a backgate (p-type well) BG connected to the ground terminal GND. For example, the n-channel enhancement-type MOS transistor 21 is formed in accordance with a typical 130 nm-node (generation) process.

A drain-to-source leakage current of the n-channel enhancement-type MOS transistor 21 can be adjusted by its threshold voltage and its size such as a gate length and/or a gate width, so that this drain-to-source leakage current is set to be larger than a leakage current of the capacitive element 11 Thus, when the electrodes 11a and 11b of the capacitive element 11 are in an insulating (non-conductive) state, the n-channel enhancement-type MOS transistor 21 is in a conductive state. On the other hand, when the electrodes 11a and 11b of the capacitive element 11 are in a conductive state, the n-channel enhancement-type MOS transistor 21 is in an insulating state.

A normal operation of the semiconductor circuit device of FIG. 1 is explained next with reference to FIGS. 2 and. 3.

As shown in FIG. 2, a drain-to-source leakage current 12 of the n-channel enhancement-type MOS transistor 21 is larger than the leakage current I1 of the capacitive element 11. As a result, as shown in FIG. 3, a voltage at the node N1 follows the power supply voltage at the power supply terminal $V_{DD}$. Thus, since the gate voltage of the n-channel enhancement-type MOS transistor 21 is close to the power supply voltage while its backgate BG is at the ground voltage, the n-channel enhancement-type MOS transistor 21 is in a conductive state.

Next, an abnormal operation of the semiconductor circuit device of FIG. 1 is explained with reference to FIGS. 4A and 4B.

Figure 4A:
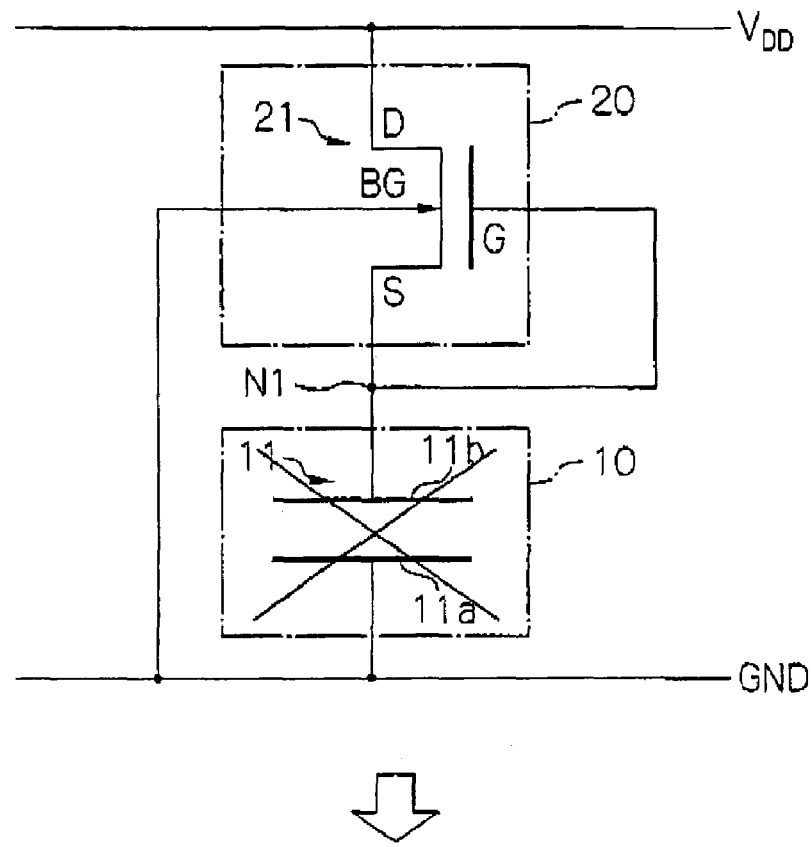
FIG. 4A is a circuit diagram for explaining an abnormal operation of the semiconductor circuit device of FIG. 1.
Figure 4B:
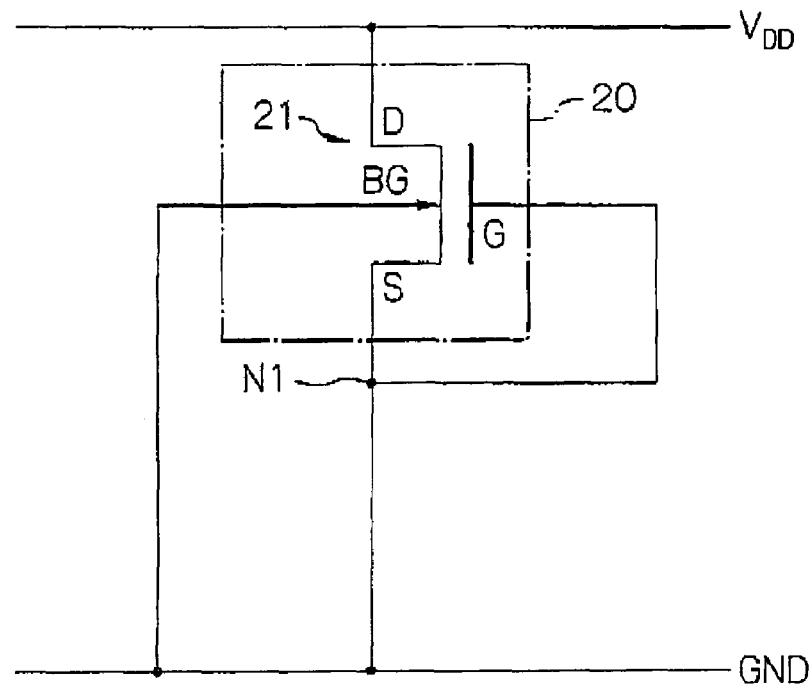
FIG. 4B is an equivalent circuit diagram of FIG. 4A.

That is, when the capacitive element 11 is electrostatically broken, i.e. the electrodes 11a and 11b of the capacitive element 11 are short-circuited as shown in FIG. 4A so that the capacitive element 11 is in a conductive state, an equivalent circuit as shown in FIG. 4B is obtained. Thus, since the gate voltage of the n-channel enhancement-type MOS transistor 21 is close to the ground voltage and its backgate BG is also at the ground voltage, the n-channel enhancement-type MOS transistor 21 is in an insulating state.

Thus, in the semiconductor circuit device of FIG. 1, even when the capacitive element 11 is in a conductive state, the short-circuit between the power supply terminal $V_{DD}$ and the ground terminal GND can be prevented to enhance the reliability.

Here, if the reliability of the capacitive element 10 is represented by $R_C$ ($0<R_C<1$), and the reliability of the n-channel enhancement-type MOS transistor 21 is represented by $R_M$ ($0<R_M<1$), the reliability $R_1$ of the semiconductor circuit device of FIG. 1 can be represented by $$R_1 = R_C + R_M - R_C \cdot R_M \quad (1)$$

Since the above-described prior art semiconductor circuit device does not include the n-channel enhancement-type MOS transistor 21 of FIG. 1, the reliability $R_0$ of the prior art semiconductor circuit device can be represented by $$R_0 = R_C$$

Therefore, $$R_1 - R_0$$
$$= R_M - R_C \cdot R_M$$
$$= R_M (1 - R_C) > 0$$
$$\therefore R_1 > R_0$$

Thus, the reliability of the semiconductor circuit device of FIG. 1 can be enhanced.

Also, since the short-circuit preventing circuit 20 is constructed by a single MOS transistor whose operation is changed in accordance with whether or not the electrodes 11a and 11b of the capacitive element 11 are short-circuited, the semiconductor circuit device of FIG. 1 can be simplified.

Further, if the capacitive element 11 is of a MOS type, since the capacitive element 11 can be formed simultaneously with other MOS transistors, the manufacturing steps of the semiconductor circuit device of FIG. 1 can be simplified. Also, in this case, the capacitance of the capacitive element 11 can be very large.

Additionally, since the backgate of the n-channel enhancement-type MOS transistor 21 is connected to the ground terminal GND, when the capacitive element 11 is in an insulating state, a conductive state of the n-channel enhancement-type MOS transistor 21 can easily be realized.

Figure 5:
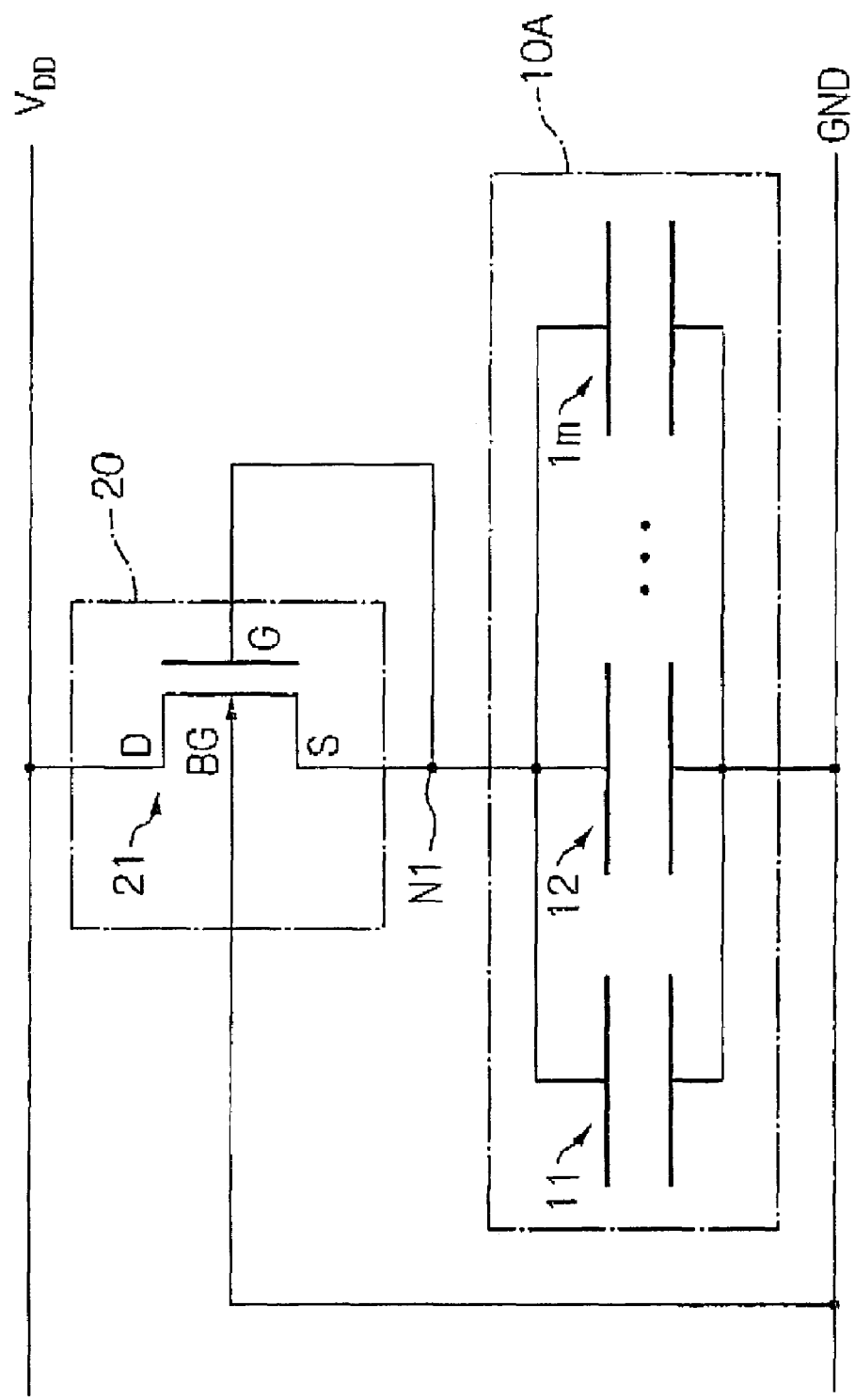
FIG. 5 is a circuit diagram illustrating a second embodiment of the semiconductor circuit device according to the present invention.

In FIG. 5, which illustrates a second embodiment of the semiconductor circuit device according to the present invention, the capacitive circuit 10 of FIG. 1 is replaced by a capacitive circuit 10A which includes a plurality of capacitive elements 11, 12, . . . , 1m connected in parallel with each other ($m \geq 2$).

In FIG. 5, the reliability $R_2$ of the semiconductor circuit device can be represented by $$R_2 = (1-R_M) \cdot R_C^m + R_M \quad (2)$$

For example, if m=2, $$R_2 = (1-R_M) \cdot R_C^2 + R_M$$

Therefore, in this case, $$R_2 - R_1 = R_C \cdot R_M (1-R_C) > 0 R_2 > R_1$$

Thus, the reliability of the semiconductor circuit device of FIG. 5 can be generally enhanced as compared with that of the semiconductor circuit device of FIG. 1.

Further in FIG. 5, the entire capacitance of the capacitive elements 1, 12, . . . , 1m can be increased as compared with the capacitance of the single capacitive element 11 of FIG. 1. If the capacitance of the single capacitive element 11 of FIG. 1 is equal to the total capacitance of the capacitive elements 11, 12, . . . , 1m of FIG. 5, the semiconductor circuit device of FIG. 5 is advantageous over that of FIG. 1 in view of the circuit layout. That is, note that decoupling capacitors are generally arranged in unused areas where functional cells (logic gate cells) are not provided. Therefore, the provision of a large number of small decoupling capacitors is preferable as compared with the provision of a single large decoupling capacitor.

Figure 6:
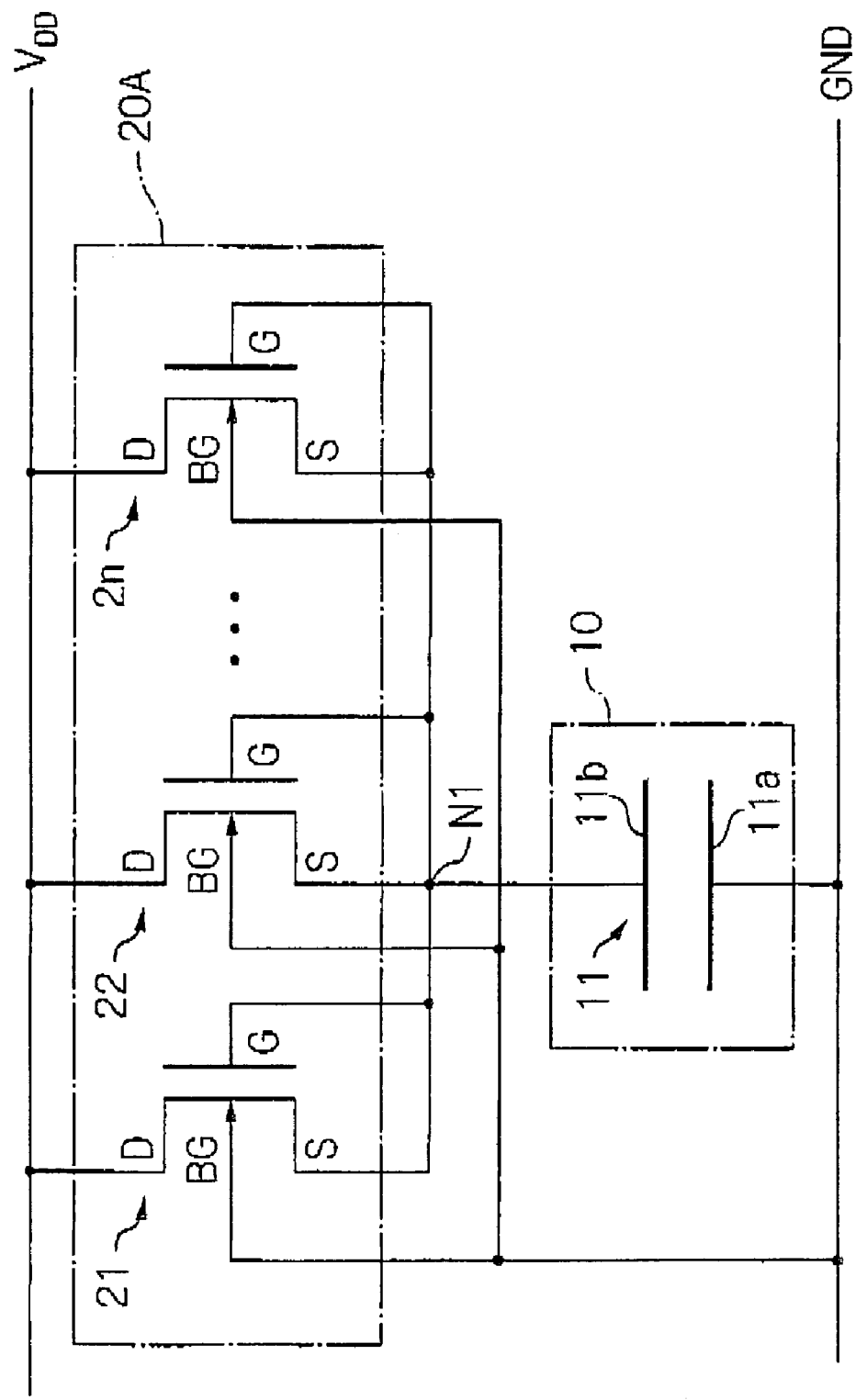
FIG. 6 is a circuit diagram illustrating a third embodiment of the semiconductor circuit device according to the present invention.

In FIG. 6, which illustrates a third embodiment of the semiconductor circuit device according to the present invention, the short-circuit preventing circuit 20 of FIG. 1 is replaced by a short-circuit preventing circuit 20A which includes a plurality of n-channel enhancement-type MOS transistors 21, 22, . . . , 2n connected in parallel with each other ($n \geq 2$).

In FIG. 6, the reliability $R_3$ of the semiconductor circuit device can be represented by $$R_3 = (1-R_C) \cdot R_M^n + R_C \quad (3)$$

For example, if n=2, $$R_3 = (1-R_C) \cdot R_M^2 + R_C$$

Therefore, in this case, $$R_3 - R_1 = R_C \cdot R_M (1-R_M) > 0 R_3 > R_1$$

Thus, the reliability of the semiconductor circuit device of FIG. 6 can be generally enhanced as compared with that of the semiconductor circuit device of FIG. 1. Also, the ON resistance of the entirety of the n-channel enhancement-type MOS transistors 21, 22, . . . , 2n can be decreased to rapidly charge and discharge the capacitive element 11.

Figure 7:
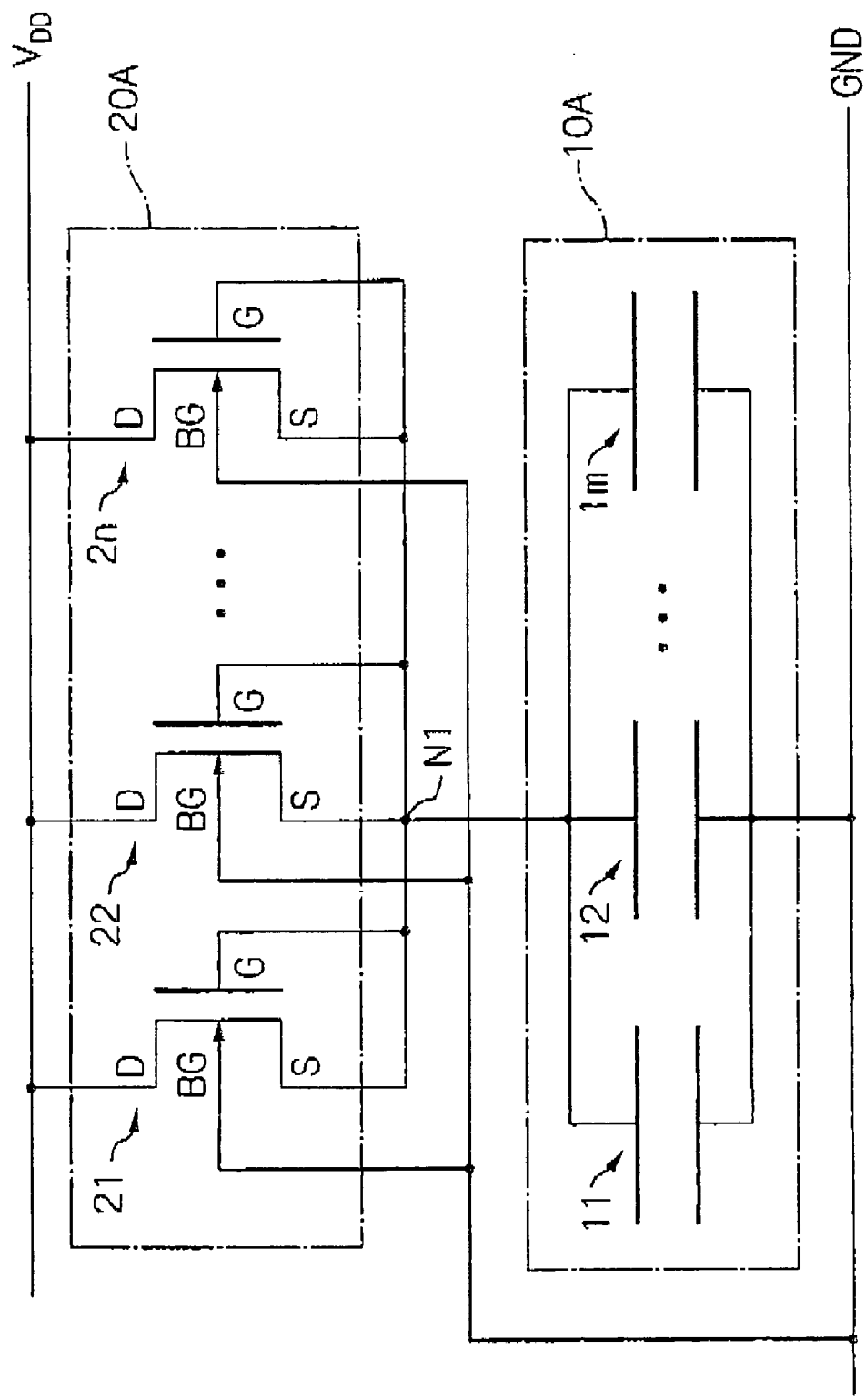
FIG. 7 is a circuit diagram illustrating a fourth embodiment of the semiconductor circuit device according to the present invention.

In FIG. 7, which illustrates a fourth embodiment of the semiconductor circuit device according to the present invention, the capacitive circuit 10 of FIG. 1 is replaced by a capacitive circuit 10A which includes a plurality of capacitive elements 11, 12, . . . , 1m connected in parallel with each other ($m \geq 2$), and also, the short-circuit preventing circuit 20 of FIG. 1 is replaced by a short-circuit preventing circuit 20A which includes a plurality of n-channel enhancement-type MOS transistors 21, 22, . . . , 2n connected in parallel with each other ($n \geq 2$).

In FIG. 7, the reliability $R_4$ of the semiconductor circuit device can be represented by $$R_4 = (1-R_M) \cdot R_C^m + (1-R_C) \cdot R_M^n \quad (4)$$

Even the reliability of the semiconductor circuit device of FIG. 7 can be generally enhanced as compared with that of the semiconductor circuit device of FIG. 1.

Figure 8:
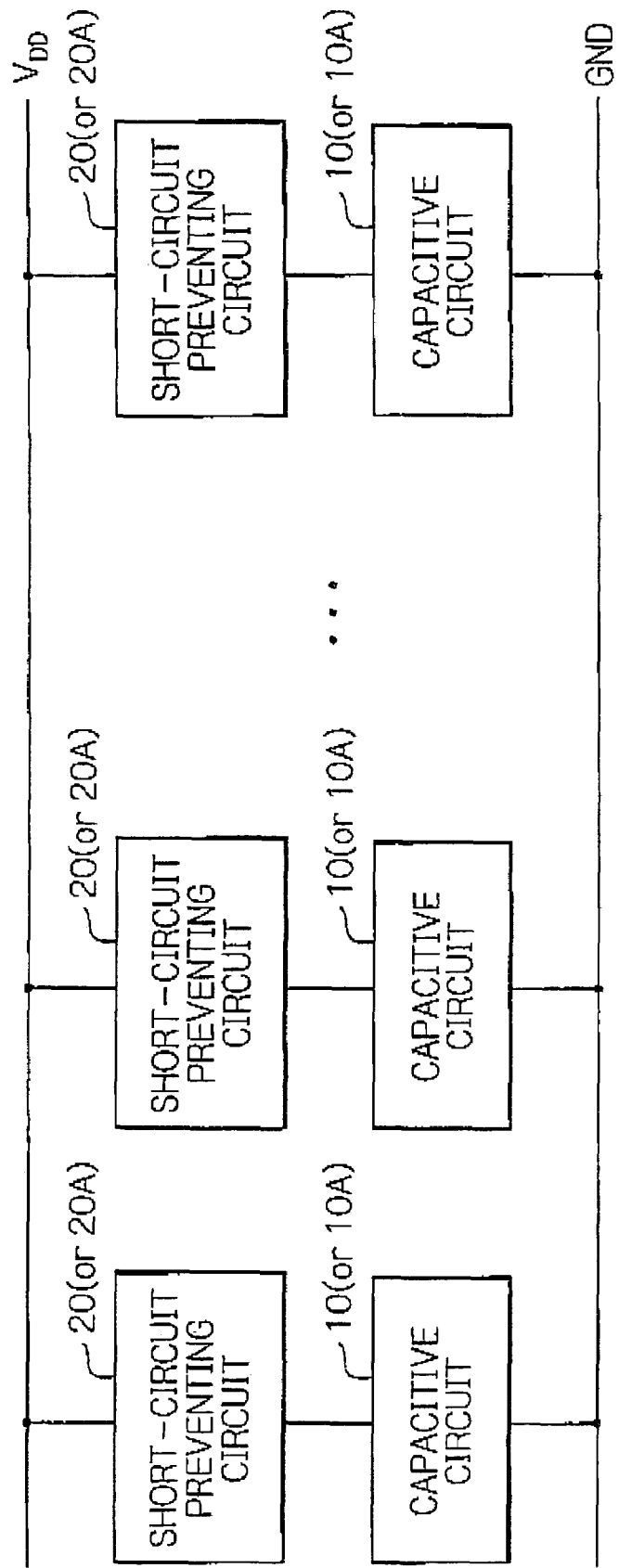
FIG. 8 is a block circuit diagram illustrating an actual semiconductor circuit device to which the embodiments of FIGS. 1, 5, 6 and 7 are applied.

In FIG. 8, which is a block circuit diagram illustrating an actual semiconductor circuit device to which the embodiments of FIGS. 1, 5, 6 and 7 are applied, a plurality of pairs each formed by one capacitive circuit 10 (or 10A) and one short-circuit preventing circuit 20 (or 20A) are provided between the power supply terminal $V_{DD}$ and the ground terminal GND. That is, generally, when each of the capacitive circuits 10 (or 10A) serves as one or more decoupling capacitors, such decoupling capacitors should be provided all over one semiconductor circuit device (one chip) to enhance the decoupling effect. In this case, each of the capacitive circuits 10 (or 10A) (decoupling capacitors) is associated with one short-circuit preventing circuit 20 (or 20A). As a result, since the short-circuit of each capacitive circuit is substantially prevented by its respective short-circuit preventing circuit, the failure rate of the semiconductor circuit devices can be improved.

In the above-described embodiments, although each of the short-circuit preventing circuits 20 (or 20A) is constructed by one or more n-channel enhancement-type MOS transistors, p-channel enhancement-type MOS transistors can be used instead of such n-channel enhancement-type MOS transistors, as illustrated in FIGS. 9, 10, 11, 12 and 13.

Figure 9:
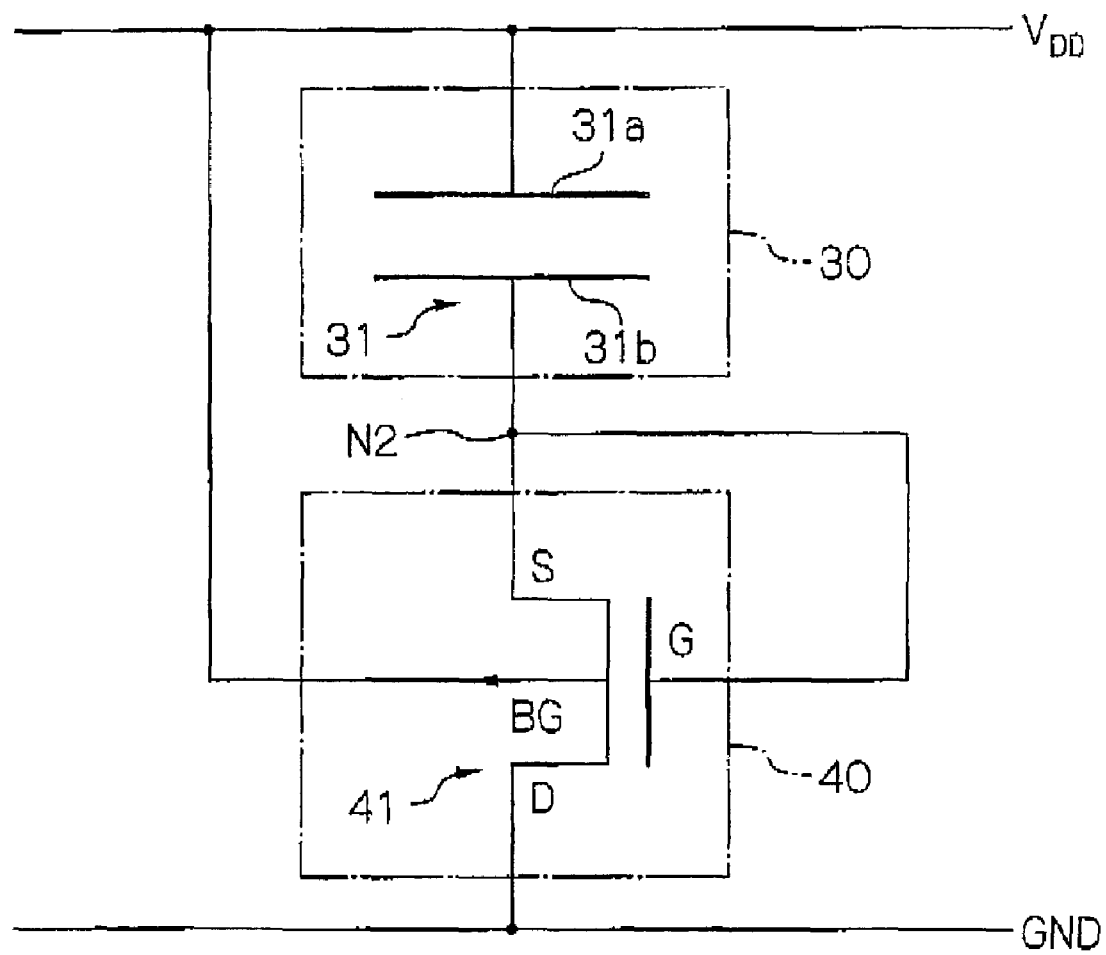
FIGS. 9, 10, 11 and 12 are circuit diagrams illustrating modifications of the semiconductor circuit devices of FIGS. 1, 5, 6 and 7, respectively.

In FIG. 9, which illustrates a modification of the semiconductor circuit device of FIG. 1, a capacitive circuit 30 including a single-capacitive element 31 and a short-circuit preventing circuit 40 including a single p-channel enhancement-type MOS transistor 41 are connected in series between the power supply terminal $V_{DD}$ and the ground terminal GND.

In more detail, the capacitive element 31 has an electrode 31a connected to the power supply terminal $V_{DD}$ and an electrode 31b connected to a node N2. For example, the area of each of the electrodes 31a and 31b is 10 µm$^2$, so that the capacitance of the capacitive element 31 is 1.23 pF. Note that the capacitive element 31 can be of a MOS type. Also, the p-channel enhancement-type MOS transistor 41 has a source S connected to the node N2, i.e., the electrode 31b of the capacitive element 31, a drain D connected to the ground terminal GND, a gate G connected to the node N2, i.e., the electrode 31b of the capacitive element 31, and a backgate (n-type well) BG connected to the power supply terminal $V_{DD}$. For example, the p-channel enhancement-type MOS transistor 41 is formed in accordance with a typical 130 nm-node (generation) process.

A drain-to-source leakage current of the p-channel enhancement-type MOS transistor 41 can be adjusted by its threshold voltage and its size such as a gate length and/or a gate width, so that this drain-to-source leakage current is set to be larger than a leakage current of the capacitive element 31. Thus, in a similar way to those of the semiconductor circuit device of FIG. 1, when the electrodes 31a and 31b of the capacitive element 31 are in an insulating (non-conductive) state, the p-channel enhancement-type MOS transistor 41 is in a conductive state. On the other hand, when the electrodes 31a and 31b of the capacitive element 31 are in a conductive state, the p-channel enhancement-type MOS transistor 41 is in an insulating state.

Also, since the reliability $R_5$ of the semiconductor circuit device of FIG. 9 can be represented by the formula (1), the reliability of the semiconductor circuit device of FIG. 9 can be enhanced.

Further, since the short-circuit preventing circuit 40 is constructed by a single MOS transistor whose operation is changed in accordance with whether or not the electrodes 31a and 31b of the capacitive element 31 are short-circuited, the semiconductor circuit device of FIG. 9 can be simplified.

Additionally, if the capacitive element 31 is of a MOS type, since the capacitive element 31 can be formed simultaneously with other MOS transistors, the manufacturing steps of the semiconductor circuit device of FIG. 9 can be simplified. Also, in this case, the capacitance of the capacitive element 31 can be very large.

Still, since the backgate of the p-channel enhancement-type MOS transistor 41 is connected to the power supply terminal $V_{DD}$, when the capacitive element 31 is in an insulating state, a conductive state of the p-channel enhancement-type MOS transistor 41 can easily be realized.

Figure 10:
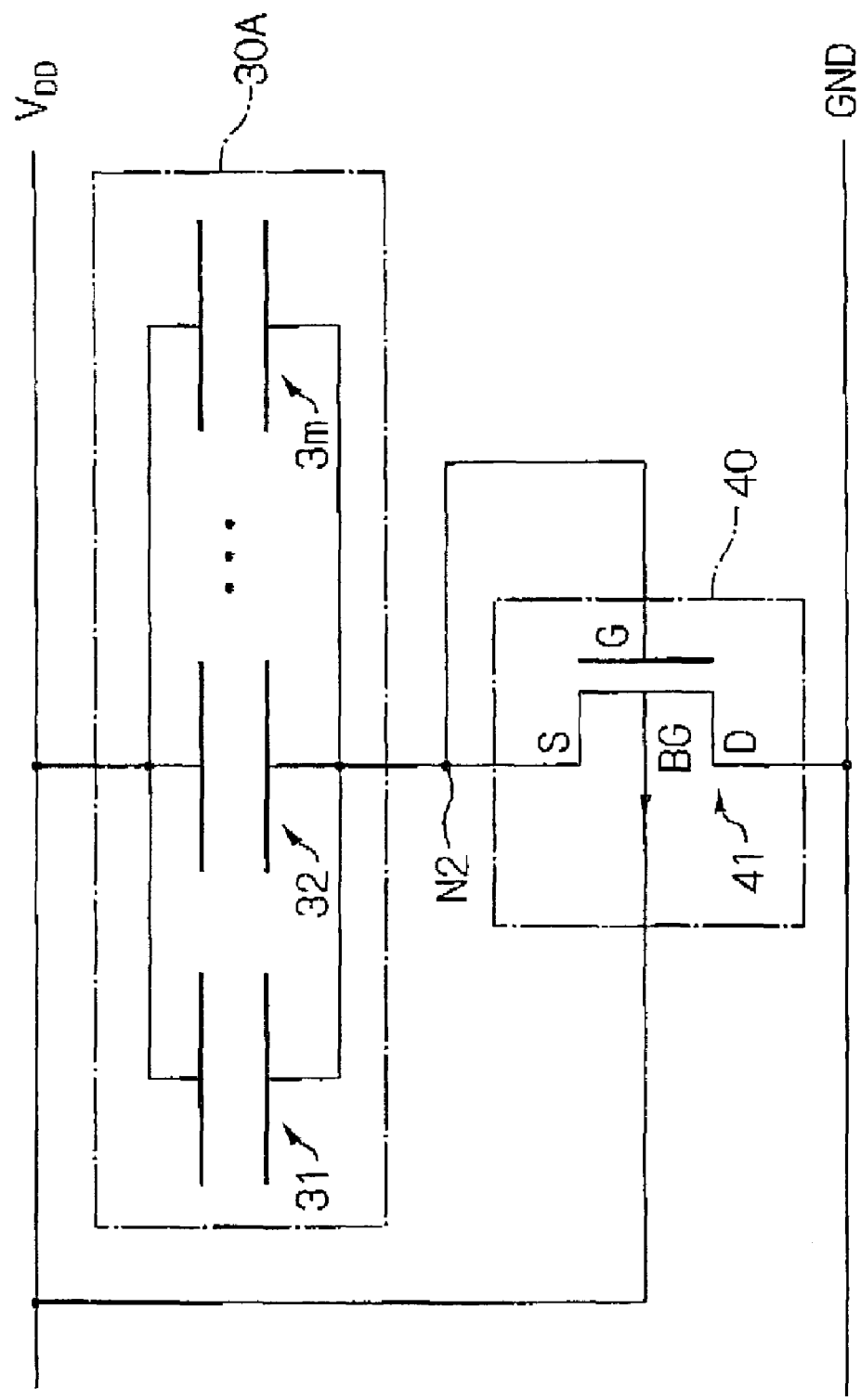

In FIG. 10, which illustrates a modification of the semiconductor circuit device of FIG. 5, the capacitive circuit 30 of FIG. 9 is replaced by a capacitive circuit 30A which includes a plurality of capacitive elements 31, 32, . . . , 3m connected in parallel with each other (m≧2).

In FIG. 10, the entire capacitance of the capacitive elements 31, 32, . . . , 3m can be increased as compared with the capacitance of the single capacitive element 31 of FIG. 9. If the capacitance of the single capacitive element 31 of FIG. 9 is equal to the total capacitance of the capacitive elements 31, 32, . . . , 3m of FIG. 10, the semiconductor circuit device of FIG. 10 is advantageous over that of FIG. 9 in view of the circuit layout. That is, note that decoupling capacitors are generally arranged in unused areas where functional cells (logic gate cells) are not provided. Therefore, the provision of a large number of small decoupling capacitors is preferable as compared with the provision of a single large decoupling capacitor.

In FIG. 10, since the reliability $R_6$ of the semiconductor circuit device can be represented by the formula (2), the reliability $R_6$ of the semiconductor circuit device of FIG. 10 can be generally enhanced as compared with that of the semiconductor circuit device of FIG. 9.

Figure 11:
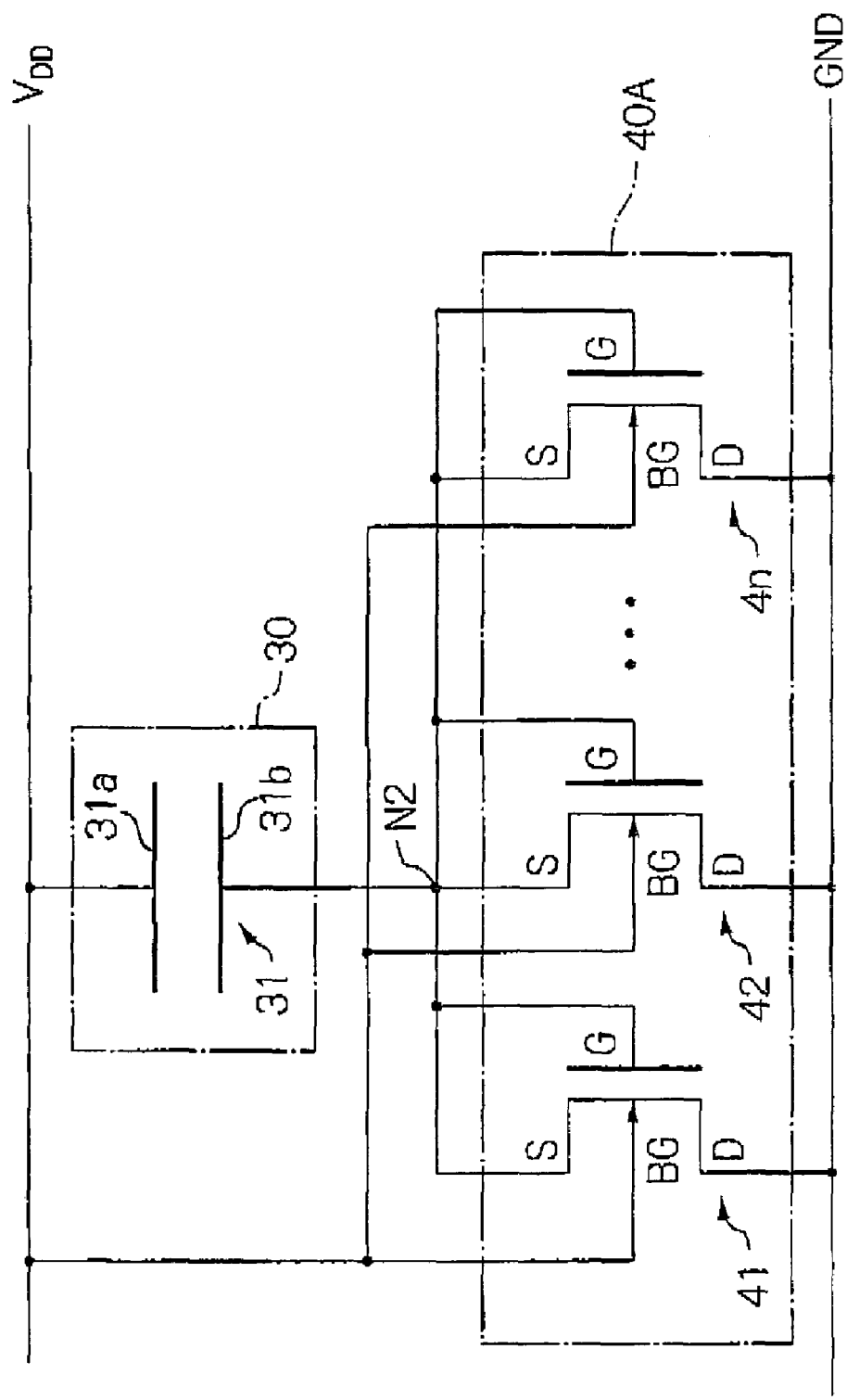

In FIG. 11, which illustrates a modification of the semiconductor circuit device of FIG. 6, the short-circuit preventing circuit 40 of FIG. 9 is replaced by a short-circuit preventing circuit 40A which includes a plurality of n-channel enhancement-type MOS transistors 41, 42, . . . , 4n connected in parallel with each other (n≧2).

In FIG. 11, the reliability $R_7$ of the semiconductor circuit device can be represented by the formula (3), the reliability of the semiconductor circuit device of FIG. 11 can be generally enhanced as compared with that of the semiconductor circuit device of FIG. 9. Also, the ON resistance of the entirety of the p-channel enhancement-type MOS transistors 41, 42, . . . , 4n can be decreased to rapidly charge and discharge the capacitive element 31.

Figure 12:
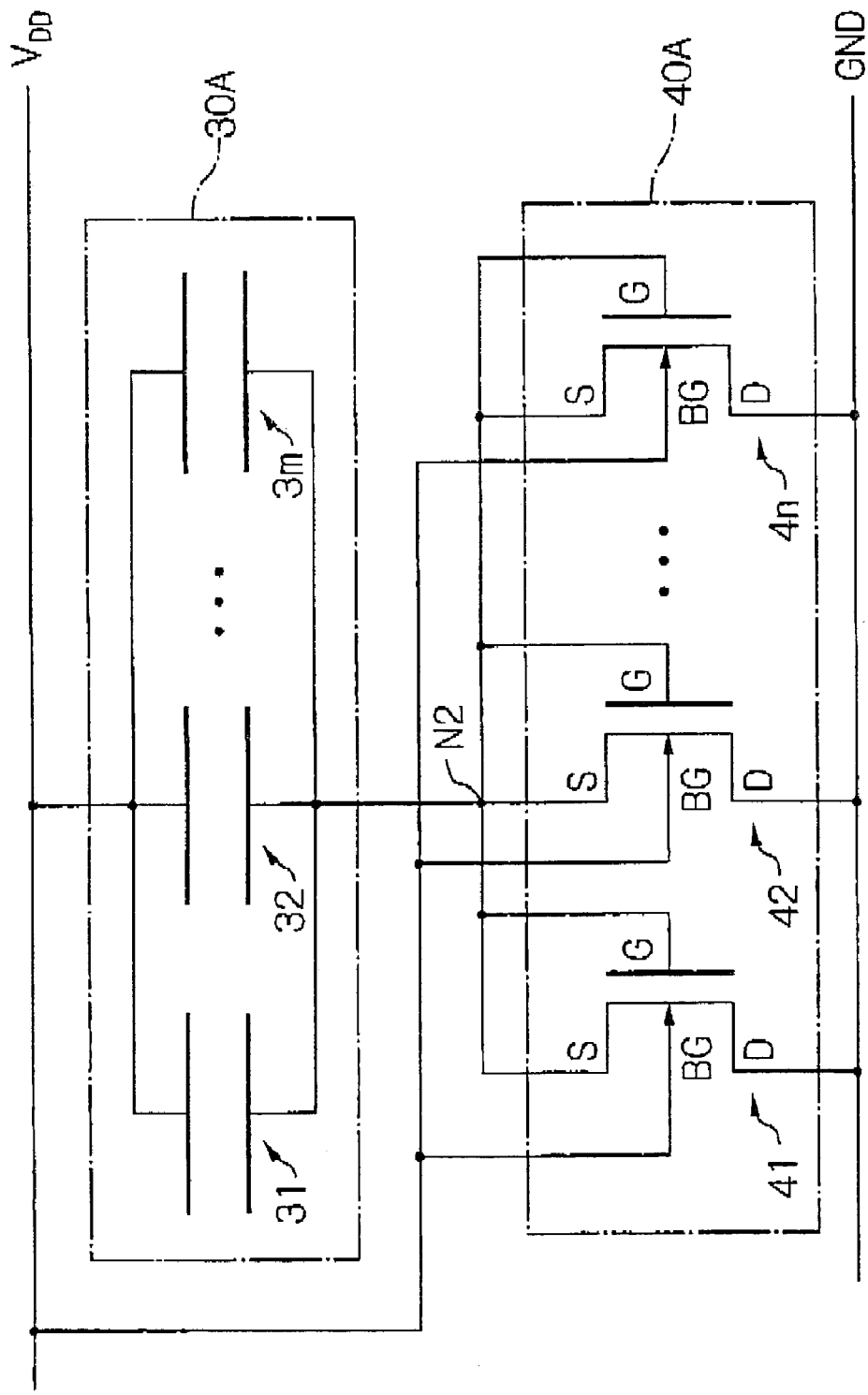

In FIG. 12, which illustrates a modification of the semiconductor circuit device of FIG. 7, the capacitive circuit 30 of FIG. 1 is replaced by a capacitive circuit 30A which includes a plurality of capacitive elements 31, 32, . . . , 3m connected in parallel with each other (m≧2), and also, the short-circuit preventing circuit 40 of FIG. 9 is replaced by a short-circuit preventing circuit 40A which includes a plurality of n-channel enhancement-type MOS transistors 41, 42, . . . , 4n connected in parallel with each other (n≧2).

In FIG. 12, as the reliability $R_8$ of the semiconductor circuit device can be represented by the formula (4), the reliability of the semiconductor circuit device of FIG. 12 can be generally enhanced as compared with that of the semiconductor circuit device of FIG. 1.

Figure 13:
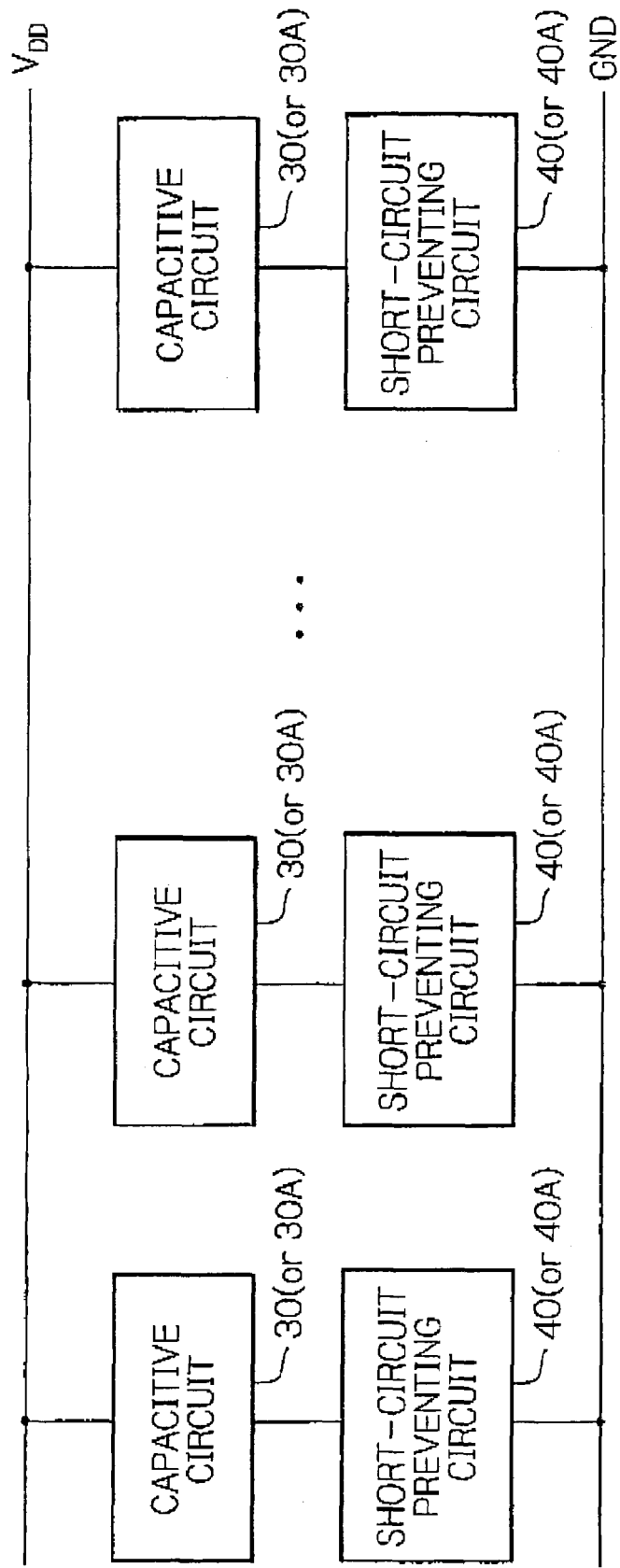
FIG. 13 is a block circuit diagram illustrating a modification of the semiconductor circuit device of FIG. 8.

In FIG. 13, which is a block circuit diagram illustrating a modification of the actual semiconductor circuit device of FIG. 8, a plurality of pairs each formed by one capacitive circuit 30 (or 30A) and one short-circuit preventing circuit 40 (or 40A) are provided between the power supply terminal $V_{DD}$ and the ground terminal GND. That is, generally, when each of the capacitive circuits 30 (or 30A) serves as one or more decoupling capacitors, such decoupling capacitors should be provided all over one semiconductor circuit device (one chip) to enhance the decoupling effect. In this case, each of the capacitive circuits 30 (or 30A) (decoupling capacitors) is associated with one short-circuit preventing circuit 40 (or 40A). As a result, since the short-circuit of each capacitive circuit is substantially prevented by its respective short-circuit preventing circuit, the failure rate of the semiconductor circuit devices can be improved.

Each of the capacitive elements 11, 12, . . . , 1m, 31, 32, . . . , 3m can serve as a decoupling capacitor for absorbing power supply voltage noise. As stated above, as the Internet has rapidly been developed, a higher integration, a higher frequency and a lower power supply voltage have been required. Therefore, in order for the capacitive elements to effectively absorb power supply voltage noise, the number of capacitive circuits 10 (or 10A) and 30 (or 30A) should be increased and also, the number of capacitive elements 11, 12, . . . , 1m, and 31, 32, . . . , 3m within the capacitive circuits should be increased. Simultaneously, in order for the capacitive elements to effectively absorb power supply voltage noise, the capacitance of each of the capacitive elements should be increased by making the insulating layer thereof thinner. In this case, however, the capacitive elements are easily subjected to electrostatical breakdown. Therefore, it is particularly important to connect one short-circuit preventing circuit according to the present invention with each capacitive element to absorb power supply voltage noise without reducing the reliability of the semiconductor circuit device including a plurality of capacitive elements.

The invention claimed is:

1. A semiconductor circuit device comprising:
   a first terminal adapted to receive a first voltage;
   a second terminal adapted to receive a second voltage lower than said first voltage; and
   a capacitive circuit and a short-circuit preventing circuit provided in series between said first and second terminals,
   wherein, when said capacitive circuit is in an insulating state, said short-circuit preventing circuit is in a conductive state, while, when said capacitive circuit is in a conductive state, said short-circuit preventing circuit is in an insulating state,
   wherein said short-circuit preventing circuit comprises an n-channel enhancement-type MOS transistor provided between said first terminal and said capacitive circuit,
   wherein said n-channel enhancement-type MOS transistor has a gate connected to one electrode of said capacitive circuit and a backgate connected to said second terminal, and
   wherein another electrode of said capacitive circuit is connected to said second terminal.

2. The semiconductor circuit device as set forth in claim 1, wherein said first terminal comprises a power supply terminal and said second terminal comprises a ground terminal.

3. The semiconductor circuit device as set forth in claim 1, wherein said capacitive circuit comprises at least one capacitive element.

4. The semiconductor circuit device as set forth in claim 2, wherein said capacitive element is of a MOS type.

5. The semiconductor circuit device as set forth in claim 2, wherein said capacitive element serves as a decoupling capacitor.

6. A semiconductor circuit device comprising:
   a first terminal adapted to receive a first voltage;
   a second terminal adapted to receive a second voltage lower than said first voltage; and
   a capacitive circuit and a short-circuit preventing circuit provided in series between said first and second terminals,
   wherein, when said capacitive circuit is in an insulating state, said short-circuit preventing circuit is in a conductive state, while, when said capacitive circuit is in a conductive state, said short-circuit preventing circuit is in an insulating state,
   wherein said short-circuit preventing circuit comprises
   a p-channel enhancement-type MOS transistor provided between said capacitive circuit and said second terminal,
   wherein said p-channel enhancement-type MOS transistor has a gate connected to one electrode of said capacitive circuit and a backgate connected to said first terminal, and
   wherein another electrode of said capacitive element is connected to said first terminal.

7. A semiconductor circuit device comprising:
   a first terminal adapted to receive a first voltage;
   a second terminal adapted to receive a second voltage lower than said first voltage; and
   a plurality of pairs of one capacitive circuit and one short-circuit preventing circuit provided in series between said first and second terminals,
   wherein, when said capacitive circuit of a respective one of said pairs is in an insulating state, said short-circuit preventing circuit of the respective one of said pairs is in a conductive state, while, when said capacitive circuit of the respective one of said pairs is in a conductive state, said short-circuit preventing circuit of the respective one of said pairs is in an insulating state,
   wherein said short-circuit preventing circuit comprises an n-channel enhancement-type MOS transistor provided between said first terminal and said capacitive circuit,
   wherein said n-channel enhancement-type MOS transistor has a gate connected to one electrode of said capacitive circuit and a backgate connected to said second terminal, and
   wherein another electrode of said capacitive circuit is connected to said second terminal.

8. The semiconductor circuit device as set forth in claim 7, wherein said first terminal comprises a power supply terminal and said second terminal comprises a ground terminal.

9. The semiconductor circuit device as set forth in claim 7, wherein said capacitive circuit comprises at least one capacitive element.

10. The semiconductor circuit device as set forth in claim 9, wherein said capacitive element is of a MOS type.

11. The semiconductor circuit device as set forth in claim 9, wherein said capacitive element serves as a decoupling capacitor.

12. A semiconductor circuit device comprising:
    a first terminal adapted to receive a first voltage;
    a second terminal adapted to receive a second voltage lower than said first voltage; and
    a plurality of pairs of one capacitive circuit and one short-circuit preventing circuit provided in series between said first and second terminals,
    wherein, when said capacitive circuit of a respective one of said pairs is in an insulating state, said short-circuit preventing circuit of the respective one of said pairs is in a conductive state, while, when said capacitive circuit of the respective one of said pairs is in a conductive state, said short-circuit preventing circuit of the respective one of said pairs is in an insulating state,
    wherein said short-circuit preventing circuit comprises
    a p-channel enhancement-type MOS transistor provided between said capacitive circuit and said second terminal,
    wherein said p-channel enhancement-type MOS transistor has a gate connected to one electrode of said capacitive circuit and a backgate connected to said first terminal, and
    wherein another electrode of said capacitive circuit is connected to said first terminal.

* * * * *